(12) United States Patent
Suzuki

(10) Patent No.: US 6,762,823 B2
(45) Date of Patent: Jul. 13, 2004

(54) ILLUMINATION SYSTEM AND SCANNING EXPOSURE APPARATUS USING THE SAME

(75) Inventor: Akiyoshi Suzuki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/880,759

(22) Filed: Jun. 15, 2001

(65) Prior Publication Data

US 2002/0018197 A1 Feb. 14, 2002

(30) Foreign Application Priority Data

Jun. 15, 2000 (JP) .................................... 2000-180009

(51) Int. Cl.⁷ .................. G03B 27/68; G03B 27/42; G03B 27/54
(52) U.S. Cl. .................. 355/52; 355/53; 355/67
(58) Field of Search .................. 355/53, 67–71; 356/399–401; 359/649–650, 766, 754

(56) References Cited

U.S. PATENT DOCUMENTS

| | | | |
|---|---|---|---|
| 5,160,962 A | 11/1992 | Miura et al. ............... | 355/53 |
| 5,557,469 A | 9/1996 | Markle et al. ............. | 359/683 |
| 5,646,413 A * | 7/1997 | Nishi ....................... | 250/548 |
| 5,715,089 A | 2/1998 | Shiraishi ................... | 359/558 |
| 5,757,838 A | 5/1998 | Hasegawa et al. .......... | 372/57 |
| 5,872,617 A | 2/1999 | Unno ........................ | 355/52 |
| 6,256,087 B1 * | 7/2001 | Bader ....................... | 355/67 |
| 6,285,443 B1 * | 9/2001 | Wangler et al. ............ | 355/67 |
| 6,349,005 B1 * | 2/2002 | Schuster et al. ........... | 359/754 |
| 6,392,742 B1 * | 5/2002 | Tsuji ........................ | 355/67 |
| 6,433,301 B1 * | 8/2002 | Dunsky et al. ............ | 219/121.67 |
| 6,452,662 B2 * | 9/2002 | Mulkens et al. ........... | 355/67 |

FOREIGN PATENT DOCUMENTS

| | | | |
|---|---|---|---|
| EP | 0 785 742 | 7/1997 | ............ G03F/7/20 |
| EP | 0 949 541 A2 | 4/1999 | |
| JP | 7-28313 | 1/1995 | ......... G03G/15/04 |
| JP | 9-167735 | 6/1997 | ......... H01L/21/27 |
| JP | 9-190966 | 7/1997 | ......... H01L/21/27 |
| JP | 10-172901 | 6/1998 | ......... H01L/21/27 |
| JP | 11-176721 | 7/1999 | ......... H01L/21/27 |

OTHER PUBLICATIONS

"O plus E", Feb., 2000, pp. 196–201.
"1999 Optics and Optical Instrument Catalog N991B," Edmund Scientific Industrial Optics Division, New Jersey, USA, pp. 218–219.
European Search Report dated Nov. 11, 2003, and issued on Dec. 3, 2003, in corresponding European patent appln. no. EP 01 30 5171.

\* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus for illuminating an original with light from a light source and for projecting a pattern of the original, as illuminated, onto a surface to be exposed, includes a hologram, an optical system for projecting light from the light source onto the hologram, a slit device disposed at a predetermined position where light of a slit-like shape is to be substantially produced by the hologram, and an imaging optical system for illuminating the original with the light passed through a slit of the slit device. The slit device serves to determine an illumination region of light projected onto the original.

19 Claims, 11 Drawing Sheets

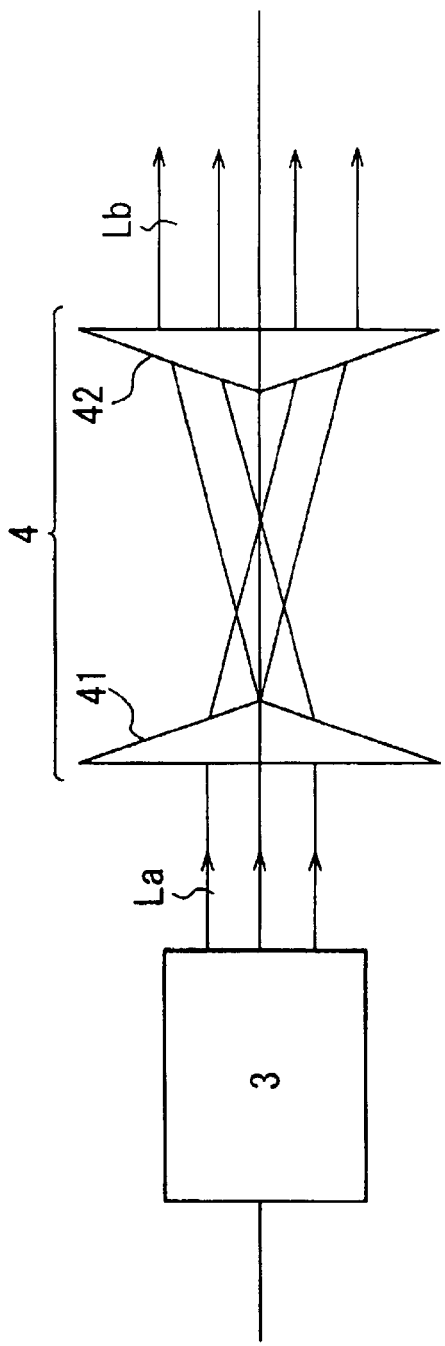
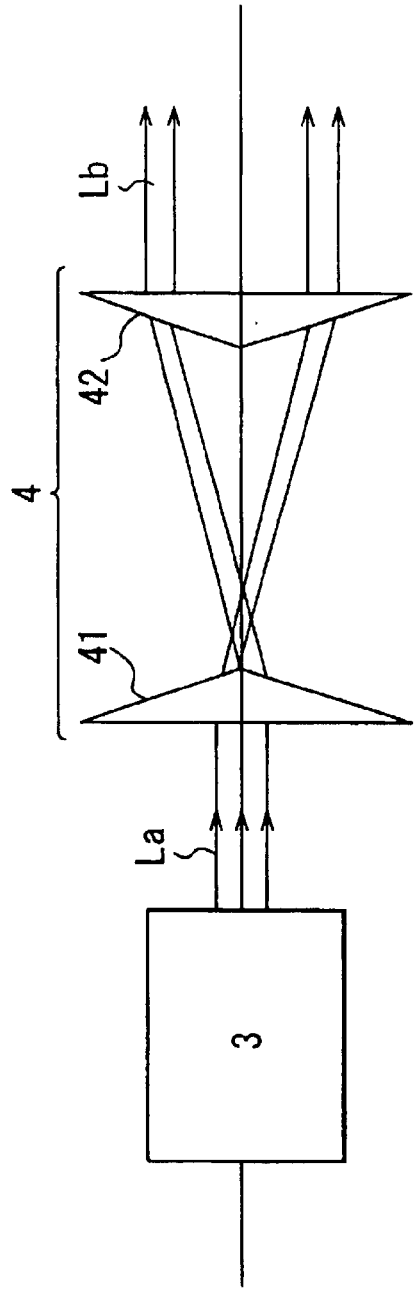
FIG. 7A
FIG. 7B

7a
ARCUATE ILLUMINATION
REGION BY CGH7

ILLUMINATION SYSTEM AND SCANNING EXPOSURE APPARATUS USING THE SAME

FIELD OF THE INVENTION AND RELATED ART

This invention relates to an illumination system and a scanning exposure apparatus using the same. The present invention is suitably applicable to a projection exposure apparatus, particularly, a scanning exposure apparatus, for use in a lithographic process among production processes for producing various devices such as ICs, LSIs, CCDs, liquid crystal panels, or magnetic heads, for example, for transferring, by projection exposure, a circuit pattern of an original such as a photomask or a reticle (hereinafter, "reticle"), being uniformly illuminated, onto a wafer while scanning the reticle and the wafer in synchronism with each other.

As a microprocessing technology for semiconductor devices such as ICs or LSIs, Japanese Laid-Open Patent Applications, Laid-Open No. 28313/1995, No. 190966/1997, No. 167735/1997, and No. 172901/1998 show scanning exposure apparatus for forming an image of a circuit pattern, formed on a reticle, upon a wafer (photosensitive substrate) through a projection optical system, while scanning the reticle and the wafer in synchronism with each other.

In this type of exposure apparatus, a reticle and a wafer are scanningly moved relative to a slit-like exposure area, by which one shot area on the wafer (and the whole pattern region defined on the reticle) is exposed. After the scanning exposure of one shot is completed, the wafer is moved stepwise to a next shot exposure position, and the scanning exposure of the next shot is initiated. This operation is repeated until exposures of the whole wafer are completed.

In accordance with recent miniaturization of a semiconductor device, the exposure wavelength is made shorter and shorter. Thus, as regards light sources to be used for the exposure, a KrF excimer laser (emission wavelength 248 nm) and an ArF excimer laser (emission wavelength 193 nm) as well as an $F_2$ excimer laser (emission wavelength 157 nm) have to be taken into account.

The miniaturization of a semiconductor device is a largest factor for supporting the dynamics of the semiconductor industry. The required linewidth has changed rapidly, from a generation requiring resolution of a linewidth of 250 nm (256 MB DRAM) to generations requiring a linewidth of 180 nm, to a linewidth of 130 nm, and to a linewidth of 100 nm.

In the lithography up to the i-line (wavelength 365 nm), resolution finer than the exposure wavelength has not been carried out. However, in the lithography using a KrF excimer laser, although its wavelength is 248 nm, it is applied to the resolution of a linewidth of 180 nm and to 150 nm. It can be said that the resolution less than the exposure wavelength has to be practiced by all means, including advancements in resist materials and super resolution technologies, for example. When various super resolution technologies are used, a linewidth corresponding to a half wavelength, in terms of lines-and-spaces, will be practicable.

However, the super resolution technologies involve many restrictions in dependence upon a circuit pattern formed on a reticle. The most effective way to improve the resolving power is to shorten the exposure wavelength and to enlarge the numerical aperture (NA) of a projection optical system. This fact generates a large motivation to shortening the wavelength, and it leads to development of lithography using an $F_2$ excimer laser.

When the exposure wavelength is to be shortened to improve the resolving power, for the exposure wavelength region shorter than 200 nm, there is a large limitation with respect to usable optical materials, and there arises a problem that the efficiency of light utilization becomes extraordinarily poor.

When an ArF excimer laser is used as a light source, optical materials usable in the region of that emission wavelength are only quartz and fluorite. When an $F_2$ excimer laser is used as a light source, only fluorite is a usable optical material. Further, while these materials are usable, there is another problem. That is, for example, while fluorite has a transmission factor of 99.9%/cm or more with respect to the emission wavelength of an ArF excimer laser, even a best sample may show a value of only 99.5%/cm to 99.6%/cm with respect to the emission wavelength of an $F_2$ excimer laser.

Situations are similar in regard to films (optical thin films). In the emission range of an $F_2$ excimer laser, use of an oxide is almost impossible, and usable materials are limited only to fluorine series compounds. As for materials of low refractive index, there are only $MgF_2$ and $AlF_3$. As for those of high refractive index, there are only $LaF_3$ and $GdF_3$, for example. Therefore, with respect to an anti-reflection film, for example, a film having attained a transmission factor of about 99.7% will obtain a transmission factor of 99%, at the best.

The performance of a film is an important factor for determining the overall efficiency of lithography, using an $F_2$ excimer laser. If it is assumed, for example, that there are ten transmissive or reflective surfaces until the light from a laser impinges on a wafer surface, the efficiency per one surface differs between 99% and 98%, for example, as can be readily understood from the relations $0.99^{100}=0.366$ and $0.98^{100}=0.133$, the difference of 1% results in a total difference of 2.5 times more.

However, in the emission range of an $F_2$ excimer laser, because of the material limitations or a difficulty in surface treatment, basically, the performance of a film is not comparable to that when a KrF excimer laser or an ArF excimer laser is used. If a good film to be used with an $F_2$ excimer laser is produced, the result can be reflected and a film of better performance can be produced for KrF and ArF excimer lasers.

As regards the film formation for use with an $F_2$ excimer laser, therefore, it is quite important to produce a film having the same performance as that of currently available films used with conventional excimer lasers. Also, it is very important to produce a film having a durability to $F_2$ excimer laser light.

Particularly, in an exposure optical system of an exposure apparatus, an illumination optical system includes more optical components than a projection optical system, and thus, the former is a key to the efficiency of light utilizations. While the projection optical system has a single function for printing an image of a reticle on a wafer without distortion, the illumination optical system is a multiple-function system having a shaping function for transforming light from a light source into an appropriate size, an integrating function for providing uniform illumination, an additional function for accomplishing various illumination modes, an imaging function for the masking, a function for controlling the light quantity, for example, and so on.

For a better light utilization efficiency of the illumination optical system, the number of optical components should be reduced as much as possible, and each constituent element should be designed to have multiple functions, or it should be simplified. On the other hand, the illumination optical system must meet requirements from the projection optical system, peculiar to the lithography using an $F_2$ excimer laser.

As an example of such requirements, when the projection optical system is a catadioptric system (an imaging optical system having a combination of mirrors and lenses), there may be cases in which, depending on the structure of the optical system, it is required to attain illumination corresponding to an imaging region of an arcuate shape. In other words, the illumination optical system is required to produce a slit-like illumination region of an arcuate shape.

As regards the catadioptric system, the optical material for a projection optical system which is usable in the emission wavelength range of an $F_2$ excimer laser is only one, i.e., fluorite. Therefore, with an ordinary dioptric system, chromatic aberration cannot be corrected. For this reason, the catadioptric system will be a good choice for a projection optical system to be used with this emission wavelength range. It should be noted here that a catadioptric system itself does not directly meet a slit-like illumination region of an arcuate shape. Depending on the structure of an optical system, a slit-like region of an oblong shape may be defined.

SUMMARY OF THE INVENTION

It is an object of the present invention to provide a good-efficiency optical system, so as to meet at least one of the strict requirements in relation to the efficiency of light utilizations, involved in the lithography using an $F_2$ excimer laser.

It is another object of the present invention to provide an illumination system and a scanning exposure apparatus, by which the number of optical components can be reduced and by which various illumination modes as well as slit shapes can be met.

In accordance with an aspect of the present invention, there is provided an illumination system, comprising: a hologram; an optical system for projecting light from a light source to said hologram; slit means disposed at a predetermined position where slit-like light is formed by said hologram or at a position adjacent thereto; and an imaging optical system for illuminating a surface to be illuminated, by use of light passing through a slit of said slit means.

In one preferred form of this aspect of the present invention, said imaging optical system may serve to image the slit of said slit means, upon the surface to be illuminated or at a position adjacent thereto.

The hologram may be disposed perpendicularly to an optical axis of an optical system following said hologram.

The illumination system may further comprise an axicon for changing the shape of light impinging on said hologram.

The illumination system may further comprise a pyramidal prism for changing the shape of light impinging on said hologram.

The illumination system may further comprise an axicon and a pyramidal prism for changing the shape of light impinging on said hologram, wherein said axicon and said prism may be inserted into or retracted out of a light path in accordance with an illumination condition.

The optical system may have a zoom lens for changing the size of light impinging on said hologram.

Parallel light may impinge on said hologram.

The illumination system may further comprise a photoelectric detecting element for receiving zeroth order light from said hologram.

The optical system may have an oblique incidence correcting optical system for causing light to be obliquely incident on said hologram and for correcting a lateral-to-longitudinal difference of effective light upon said hologram due to the oblique incidence.

The imaging optical system may have a Dyson optical system.

The shape of the slit may be oblong or arcuate.

The slit means may have a first light blocking blade disposed at a position optically conjugate with the surface to be illuminated, and a second light blocking blade disposed at a position shifted from the optically conjugate position in an optical axis direction.

The illumination system may further comprise oscillation means for oscillating said hologram.

The slit-like light may be formed by passing diffraction light from said hologram through a Fourier transform lens.

The Fourier transform lens may comprise a telecentric system.

The Fourier transform lens may be arranged so that a portion of, or the whole of, the same is movable along an optical axis direction.

In accordance with another aspect of the present invention, there is provided an illumination system for use in an exposure apparatus, characterized by a hologram effective to define a slit-like illumination area upon a surface to be illuminated, through or without an optical system.

In accordance with a further aspect of the present invention, there is provided a scanning exposure apparatus, characterized in that a reticle is placed on a plane which is to be illuminated by an illumination system as recited above, that the reticle is illuminated with the illumination system, and that a pattern formed on the reticle is transferred by projection exposure onto a wafer through a projection optical system while the reticle and the wafer are scanningly moved in synchronism with each other.

In accordance with a yet further aspect of the present invention, there is provided a device manufacturing method, comprising the steps of: coating a wafer with a photosensitive material; transferring, by projection exposure, a pattern formed on a reticle onto the wafer by use of a scanning exposure apparatus as recited above; and developing the photosensitive material on the exposed wafer.

An illumination system or a scanning exposure apparatus using the same, to be described below, uses a hologram for producing illumination light having a slit-like sectional shape. Also, there is an optical system in which the light to be incident on the hologram is convergent light, being converged toward a "particular point", and in which the sectional shape of the convergent light is controlled into a desired shape.

Here, if the "particular point" is infinite, the light incident on the hologram is parallel light. If, on the other hand, it is a virtual point, the incident light becomes apparently divergent light. Anyway, it is important that a particular point is fixed.

Among them, one which simplifies the structure is the case of parallel light. Handling the light in the form of parallel light leads to a reduction in the number of optical components. Also, it is advantageous with respect to the characteristic of a coating film.

A hologram has a property that, when light incident thereon is light being converged toward a "particular point", an image can be produced even if only a portion of the incident light is used. Thus, by changing the sectional shape of the incident light to a desired shape, an illumination optical system which causes small degradation of illuminance in response to a change in illumination mode, can be accomplished.

An example of an illumination system of an exposure apparatus using a hologram is disclosed in Japanese Laid-Open Patent Application, Laid-Open No. 176721/1999, filed by the same assignee of the subject application.

A hologram may be used to produce a desired distribution such as a ring illumination zone, at the position of an optical integrator, and it may function to control the light quantity distribution to be produced at the position of a pupil of a projection optical system.

In one embodiment, the formation of a slit-like shape to be used for the exposure is accomplished by using a shape converting function of a hologram itself. For conversion of the beam shape at a pupil position, separate means such as a pair of axicons, to be described later, or the like, is used.

As a hologram, a CGH (Computer Generated Hologram) which can be produced by computing diffraction patterns by using a computer, is used. As regards the slit shape to be produced, it is not a pattern aiming at the resolution limit, but a simple pattern of an oblong shape or arcuate shape, of the millimeter order. Thus, it can be produced easily by calculations.

As regards the type of hologram, both a transmission type and a reflection type are usable. As for the structure of a reflection type, the same structure is attainable regardless of the wavelength, only by changing a coating film. Therefore, versatile disposition is attainable. On the other hand, the transmission type shows a better transmission factor, and a CGH made of fluorite may be preferable for the lithography using an $F_2$ excimer laser.

As regards the control of the shape of light incident on a hologram, a combination of a zoom optical system with an optical system having a pair of axicons will provide good efficiency. A system or systems corresponding to various beam shapes can be constructed.

With the structure described above, the illumination system has a flexibility to meet various illumination modes, and it effectively overcomes the problem of efficiency, which is very important in the lithography using an $F_2$ excimer laser.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 7A and 7B are schematic views, respectively, for explaining the optical function of a double-axicon system, in the FIG. 1 embodiment.

DESCRIPTION OF THE PREFERRED EMBODIMENTS

Figure 1:
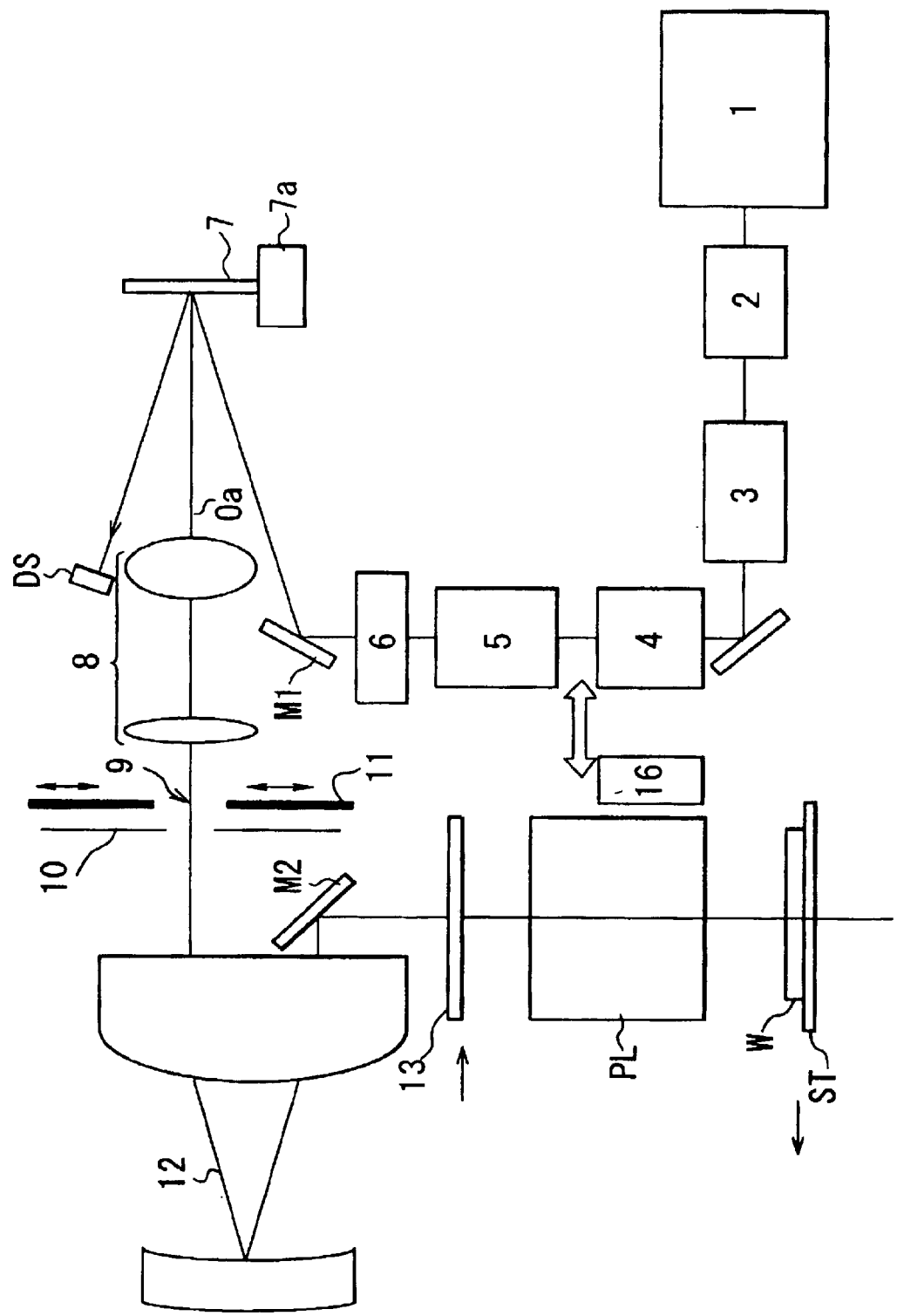
FIG. 1 is a schematic view of a main portion of a first embodiment wherein an illumination system of the present invention is incorporated into a scanning exposure apparatus.

FIG. 1 is a schematic view of a main portion of a first embodiment of the present invention, wherein an illumination system of the present invention is incorporated into a scan type projection exposure apparatus.

This embodiment is directed to a scan type exposure apparatus in which light emitted from a light source 1 such as a laser, for example, is incident as light having a slit shape, onto a reticle 13 by means of an illumination optical system. A circuit pattern formed on the reticle 13 thus illuminated is projected and printed on a substrate (wafer) W, being coated with a photosensitive material, through a projection lens (projection optical system) PL, while the reticle 13 and the wafer W are scanningly moved as depicted by arrows in the drawing, in synchronism with each other. This scanning exposure apparatus is usable in a lithographic process for the manufacture of semiconductor devices such as ICs or LSIs, image pickup devices such as CCDs, and devices such as magnetic heads, for example.

Denoted in FIG. 1 at 1 is light source means which comprises an $F_2$ excimer laser. The light flux (beam) emitted from the $F_2$ excimer laser 1 has a sectional shape being normally oblong. As regards the light intensity distribution thereof, it is near a flat distribution with respect to the lengthwise direction of the oblong shape, whereas it is near a Gaussian distribution with respect to the widthwise direction. The light emitted from the $F_2$ excimer laser is, first, shaped by a beam shaping optical system 2 into a beam diameter to be matched with an optical system following it. One of the properties to be adjusted by the beam shaping optical system is the aspect ratio (lateral-to-longitudinal ratio) of the beam. The beam shaping optical system 2 is provided by a combination of plural cylindrical lenses, and it serves to convert the beam shape of received light, having a sectional shape of an oblong beam shape, into a square beam shape.

Also, the beam shaping optical system 2 of this embodiment has an additional function of converting the light intensity distribution of the received light, which is a Gaussian distribution with respect to the widthwise direction, to one close to a uniform light intensity distribution.

Figure 5:
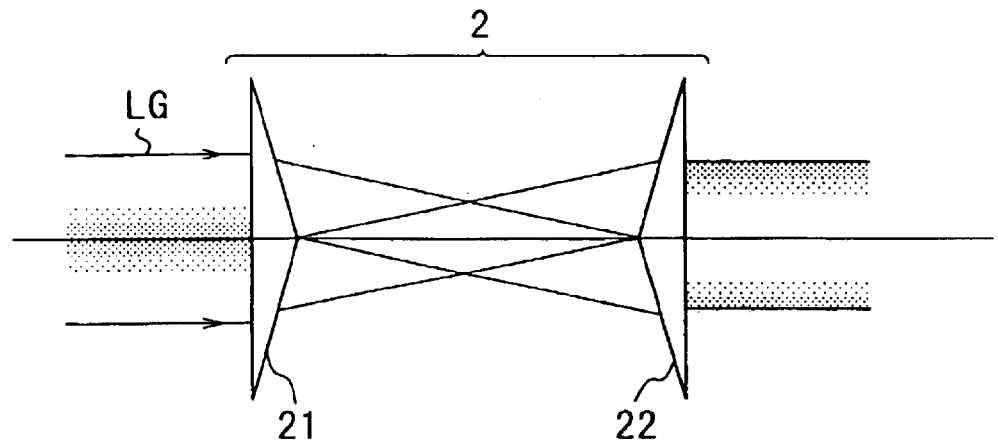
FIG. 5 is a schematic view for explaining the optical function of a beam shaping optical system in the FIG. 1 embodiment.

FIG. 5 is a sectional view of the beam shaping optical system 2 along a section as viewed from the lengthwise direction, and it illustrates that the beam shape having a Gaussian light intensity distribution is transformed, by directing incident light LG through two roof-type transmissive prisms 21 and 22, into one close to a uniform light intensity distribution. In FIG. 5, portions having a larger light intensity are illustrated by dark dots.

Since the parallel light LG incident on the prism 21 emits from the prism 22 as parallel light, these two prisms 21 and 22 can have the same angle and the same shape. Also, optimization based on the location can be done.

It is seen from FIG. 5 that uniformness is accomplished by a lateral shift and superposition between two light beams of a Gaussian distribution, as divided at the center. By adjusting the amount of this lateral shift, a most uniform beam can be produced.

An alternative form of such a beam shaping optical system 2 for producing a uniform light intensity distribution, from a Gaussian distribution, may be a uniform light quantity distribution providing a dioptric system (FIL) such as discussed in "O Plus E", February, 2000, pages 196–201.

An actually obtainable effective distribution, although stated as being square above, is dependent upon the light emission distribution from the original laser 1. Thus, the beam shape of an actual light intensity distribution is nearly circular. For this reason, in this embodiment, the light in the optical system will be taken as having a sectional shape being transformed into a circular shape.

If necessary, a stop having a circular opening may be disposed just after the beam shaping optical system 2, to perform further beam shaping.

In this embodiment, the light which is going to impinge on a CGH 7, to be described later, will be referred to as being controlled to be parallel light when the same is just emitted from each unit.

Figure 6A:
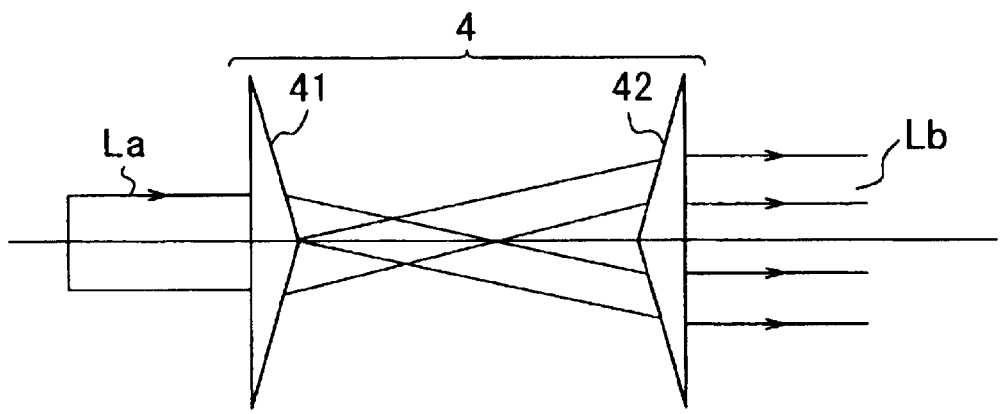
FIGS. 6A and 6B are schematic views, respectively, for explaining the optical function of a double-axicon system, in the FIG. 1 embodiment.
Figure 6B:
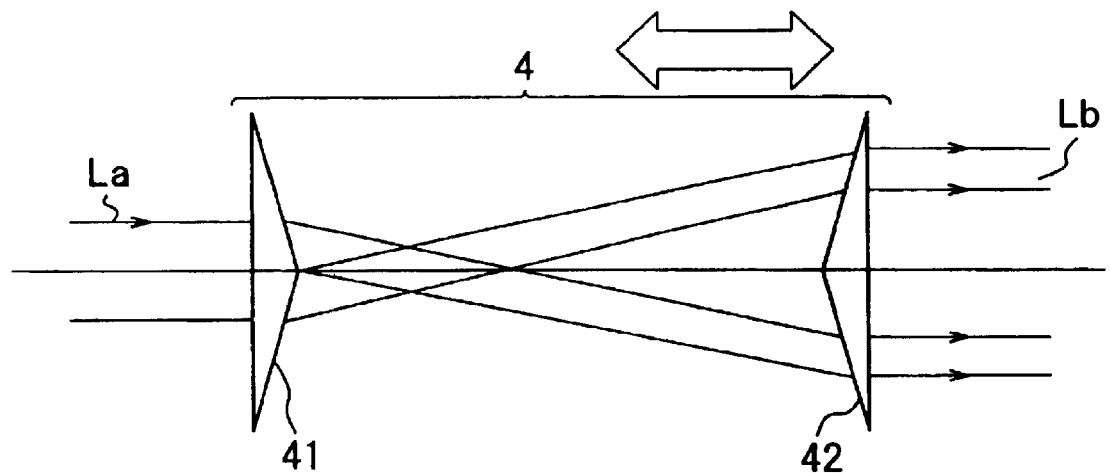

An optical unit 3 following the beam shaping optical system 2 is an adjusting zoom unit for adjusting beam diameter. It serves to control the diameter of a light beam impinging on a subsequent double-axicon unit 4, by changing its zoom ratio. It is to be noted that, since the function of the adjusting zoom unit 3 is duplicate with a zoom unit 5, to be described later, one of them may be omitted. FIGS. 6A and 6B are schematic views for explaining the double-axicon unit 4 of this embodiment.

In this embodiment, the double-axicon unit 4 comprises a light transmission type optical system. The reason for this is that, with respect to an emission wavelength region of the $F_2$ excimer laser, the light transmission type provides a better light utilization efficiency than the light reflection type. When an ArF excimer laser or a KrF excimer laser is used, a reflection type structure will provide an equivalent light utilization efficiency.

In this embodiment, for this reason, two axicons (conical prisms) 41 and 42 are used in combination, as shown in FIG. 6A or 6B. By changing the spacing between them, light La of a circular shape is transformed into light Lb of an annular shape, having a desired ring ratio (ratio between the inside diameter and the outside diameter).

As shown in FIGS. 6A and 6B, it is also the case with this that the light La incident on the double-axicon unit 4 as parallel light emits therefrom as parallel light. Therefore, the two axicons 41 and 42 may have the same angle and may be provided by the same optical components.

The case shown in FIG. 6A or 6B is an example wherein the diameter of light impinging on the double-axicon unit 4 is constant. It is seen from the drawings that the difference between the outside diameter and the inside diameter of the light Lb (i.e., the width of the ring) is constant. Thus, by adjusting the distance between these two axicons 41 and 42, the value of the ratio between the inside and outside diameters, constituting the annular ring, is changed as desired. However, in that case, the size of the beam as the same emits from the last axicon 42 is changed. Therefore, the zoom unit 5 following it is used to adjust the beam diameter.

To the contrary, if the adjusting zoom unit 3 can adjust the beam diameter, the diameter of light impinging on the axicon 41 can be controlled. Therefore, when the spacing between the axicons 41 and 42 is fixed, the outside diameter of the beam emitted from the axicon 42 is fixed.

As shown in FIGS. 7A and 7B, when the diameter of the light beam La impinging on the axicon 41 is changed by means of the adjusting zoom unit 3, the inside diameter of the beam Lb emitted from the axicon 42 is changed thereby. Therefore, by this, the ratio between the inside and outside diameters of the beam Lb can be changed as desired.

In this embodiment, with the combination of the zoom adjustment through the adjusting zoom unit 3 and the adjustment of the spacing between the axicons 41 and 42, constituting the double-axicon unit 4, an annular beam of a desired shape and a desired size can be emitted from the axicon 42. In this case, the ratio of outside and inside diameters of the beam is determined by the distance between the axicons 41 and 42, while the beam outside diameter is determined by the adjustment quantity of the adjusting zoom 3. Here, there may be a case where the inside diameter is zero.

The control of the inside and outside diameters of the beam described above is effective to accomplish ring zone illumination. An annular parallel light having a desired ratio of inside and outside diameters or circular parallel light can be produced easily.

While this embodiment uses a combination of two axicons, having a conical shape, to accomplish ring zone illumination, a double-pyramid unit 16 comprising a set of pyramid prisms may be used. This enables quadruple illumination.

On that occasion, the double-axicon unit 4 and the double-pyramid unit 16 may be provided in a turret-like fashion, so that a desired unit can be inserted into the light path in accordance with the rotation of the turret.

The zoom unit 5 adjusts the beam diameter, and the function thereof is duplicate with that of the adjusting zoom unit 3. One of them may be omitted, as described above. The light emitted from the zoom unit 5 is, while being kept as parallel light, directed to a CGH (Computer Generated Hologram) 7 via an oblique incidence correcting optical system 6 and a mirror M1.

In place of parallel light, a convergent light being converged stably toward a certain finite distance may be incident on the CGH 7. Parallel light is the case wherein the "certain distance" is infinite.

Denoted at 6 is an oblique incidence correcting optical system which serves to direct the beam from the zoom unit 5 to the CGH 7 by way of a mirror M1.

In this embodiment, the CGH 7 comprises a reflection type. In this embodiment, the CGH 7 surface which can be considered as being planar is set perpendicularly to an optical axis O, extending from the reticle 13 through the illumination optical system. Diffraction light being diffracted by the CGH 7 is used as illumination light (exposure light), whereas regular reflection light is not used as main light. Therefore, the optical axis relation before and after the CGH 7 does not comply with the low of normal reflection, as seen in the disposition of FIG. 1.

As a result, the beam incident on the CGH 7 is oblique incidence light with respect to the CGH surface. Therefore, if the light having a substantially circular sectional shape and being emitted from the double-axicon unit 4 and then adjusted by the zoom unit 5 is directly incident on the CGH 7, the shape of the light beam upon the CGH 7 becomes elliptical.

In order to correct this, the oblique incidence correcting optical system 6 comprises an anamorphic system to remove an aspect difference (lateral-to-longitudinal difference) of the effective diameter of the beam upon the CGH 7. With this arrangement, the light upon the CGH 7 can have a circular effective diameter with respect to an optical system following it, and the matching of optical systems before and after the CGH 7 is accomplished.

In this embodiment, deformation of light in relation to various illumination modes of the illumination optical system is all carried out at a portion where the light is parallel light. Therefore, in the designing, only axial light should be taken into account. It does not need to consider aberration of abaxial light. As a result, constitutional components of the illumination optical system can be significantly reduced. Since it is very important to decrease the number optical elements (components) of an optical system where an $F_2$ excimer laser is used, this embodiment provides a large advantage in this respect.

Further, using the portion where the light is parallel light means that the incidence angle to a film (optical thin film) is restricted. Therefore, a film applicable to a narrow-band wavelength, not a broad-band wavelength, can be used. As a result, a high reflection factor can be used as a narrow band barter.

As regards the light incident on the hologram, generally, it is only necessary that the light is converged at a particular point. When the particular point is at infinity, the incident light is parallel light. If it is a virtual pont, the incident light is apparently divergent light. Anyway, it is important that a particular point can be determined. For the reasons described above, parallel light provides a best efficiency, and the structure is simplest.

Since the CGH 7 used in this embodiment is a kind of hologram, the same applies to it.

In this embodiment, the CGH 7 has a reflection type structure. One of the advantages of the CGH 7 is that, if parallel light of a fixed incidence angle is incident, substantially the same image is obtainable regardless of whether a portion of the CGH or the whole of the CGH is illuminated.

Particularly, since only fluorite is an optical material usable with laser light from an $F_2$ excimer laser, chromatic aberration cannot be corrected in a conventional dioptric system. In consideration of it, there is a possibility that a catadioptric system having a combination of a mirror and a lens is adopted. However, with a catadioptric system, due to the restriction attributable to the use of a mirror, there is a possibility that an arcuate region of a projection optical system is used, against a conventional oblong-shape slit region. Since an illumination system is a unit being independent of a projection system, it is desirable that the system has a flexibility to meet the situation of the projection optical system.

Figure 12:
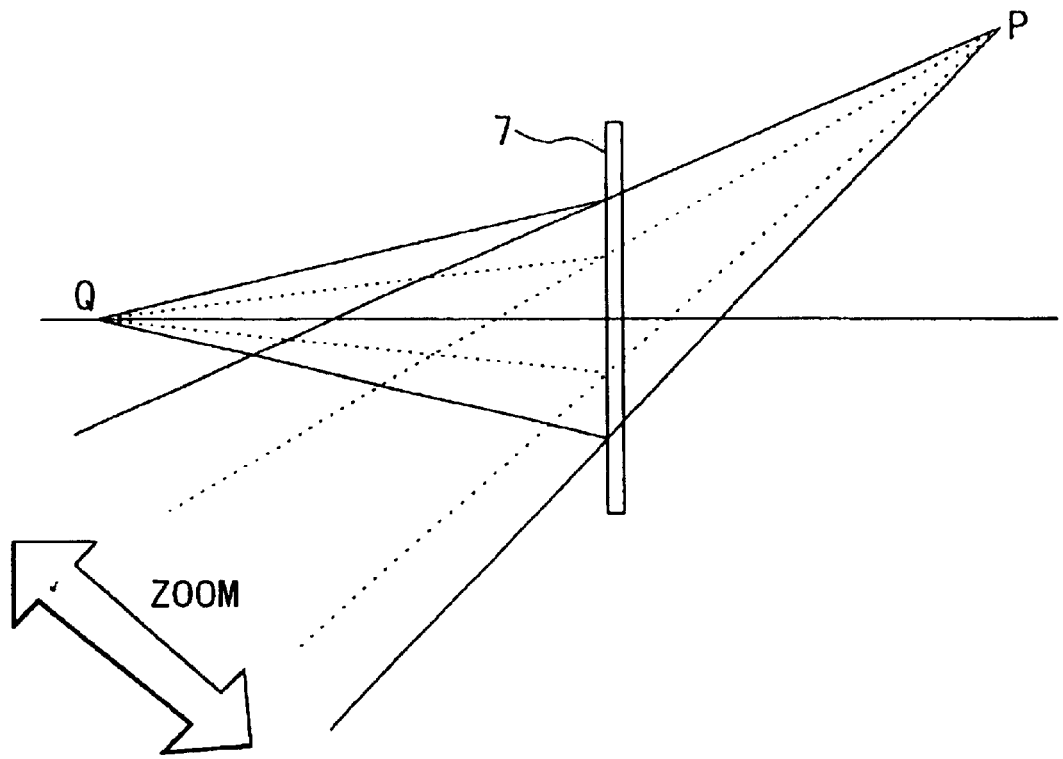
FIG. 12 is a schematic view for explaining the relation between image reproduction by a hologram and incident light thereon.

FIG. 12 illustrates the principle that, regardless of the sectional shape of light incident on a hologram 7, an image can be formed at the same position, as a slit-like illumination region.

In FIG. 12, the light being projected onto the hologram (CGH) 7 from the left hand side is light which is converged toward a point P, being a fixed point with respect to the hologram. The imaging position is the same (point Q), for the light depicted by solid lines and for the restricted effective light depicted by broken lines. In FIG. 12, the hologram itself has an imaging function. However, when a Fourier transform lens is used such as shown in FIG. 1, even if the incident light is restricted, an image is produced at the same position (Q) as long as the point P is at the same position.

When the point P is at infinity, incident light on the hologram is parallel light, as in the case described hereinbefore.

The CGH 7 has a beam shape converting function. If, therefore, an exclusive CGH 7 is used, a slit image of a desired shape such as arcuate or oblong, for example, can be produced on its Fourier transform plane or an image plane, in response to incidence of parallel light. Since the shape of slit-light like to be used in the illumination system is large and simple, it does not aim at the limit of resolving power, and the calculation is very easy in the case of a CGH for an oblong-shaped slit and in the case of a CGH for an arcuate slit.

As described hereinbefore, since the CGH 7 can reproduce an image as long as light impinges on a portion thereof, the slit shape to be reproduced is unchangeable even if the shape of the incident beam changes in accordance with various conditions of the illumination system.

As long as an exclusive CGH is used, regardless that the region (exposure area) for illuminating the circuit pattern of the reticle 13 is an arcuate slit or an oblong slit, it can be met inside the illumination system, by changing the CGH.

This means that the structure of the illumination system can be made versatile, with respect to machines of plural generations, from ArF excimer lasers to $F_2$ excimer lasers. Therefore, it has a large practical value.

Further, in the same generation of ArF excimer lasers and $F_2$ excimer lasers, there will occur changes in projection optical systems due to enlargement of the numerical aperture (NA) of the projection optical system or to improvements of its function, for example. In response to a change in slit shape to be produced thereby, only by changing the CGH, a desired slit shape is obtainable in the illumination system of this embodiment. Thus, it can be met without changing the basic structure.

One of the reasons for using a reflection type CGH is that, if a transmission type is used, a fluorite substrate has to be used as the material of the CGH, in relation to the wavelength of 157 nm of a laser from an $F_2$ excimer laser. The fluorite involves a problem of a difficulty in etching. When an ArF excimer laser or a KrF excimer laser is used, a quartz substrate can be used, and it can be etched easily. Thus, this is a problem peculiar to the use of an $F_2$ excimer laser.

Etching of fluorite is a technology which is just being developed. On the other hand, when a reflection type is used, quartz or any other glass material, a metal material or any material currently available may be used therefor. It can be free of the problem using fluorite.

As shown in FIG. 1, zeroth order light, which is regular reflection light from the CGH 7, is directed to a sensor SD for a light integrator for controlling the light quantity. While a conventional light quantity controlling sensor has to use a half mirror inserted into the light path, in this embodiment, the zeroth order light, which is unnecessary light, is used.

An image as actually produced by the CGH 7 has a fine interference fringe, called a speckle. This is because of the coherency of the laser light itself. It will be a disturbance to the exposure. In consideration of it, in this embodiment, the CGH 7 is minutely oscillated, by oscillation means 7a, in a plane perpendicular to the optical axis, after being reflected by the CGH 7, whereby the speckle is averaged.

In the practical exposure process, when a pulse laser such as an excimer laser is used, the exposure cannot be complied with only by one pulse. A plurality of pulses such as, for example, more than thirty pulses, are applied as integrated exposure light. If the CGH 7 moves in a plane perpendicular to the optical axis, although, in a macroscopic sense, the position of an image of the slit is unchanged, in the microscopic sense, the state of the speckle changes. Thus, by superposing them, the influence of the speckle can be suppressed.

The light reflected by the CGH 7 enters a Fourier transform lens 8. The Fourier transform lens 8 serves to Fourier-transform the light diffracted by the CGH 7, and to produce a desired split shape at the position on the focal plane 9 of the Fourier transform lens 8.

The position of the focal plane 9 is optically conjugate with the pattern surface of the reticle 13, with respect to a subsequent masking optical system 12.

In this embodiment, the masking optical system 12 uses a Dyson optical system and, therefore, the Fourier transform lens 8 may preferably be telecentric on the focal plane 9 side. Also, as an adjusting function for the telecentricity, the Fourier transform lens 8 as a whole can be moved along the optical axis direction or, alternatively, it has a zoom function. This enables fine adjustment of the telecentricity.

In this embodiment, the Fourier transform lens 8 is not always necessary. When the hologram itself has an imaging function as described with reference to FIG. 12, the Fourier transform lens 8 may be omitted. However, on that occasion, a field lens for adjusting the positional relation of a pupil to the optical system following it, should be provided adjacent to a slit 10.

Figure 8:
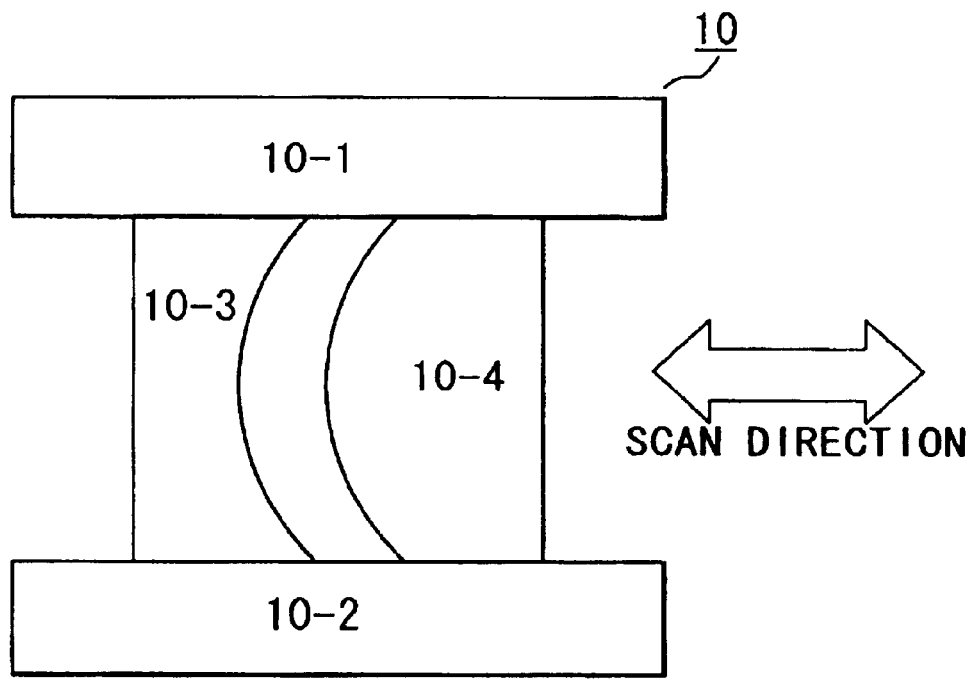
FIG. 8 is a schematic view for explaining blades which constitute an arcuate slit, in the FIG. 1 embodiment.

Denoted at 10 is a scanning slit (slit means) having a slit-like opening. It may comprise, for example, four light blocking blades when the slit is oblong. If the slit is arcuate, the slit means may comprise four light blocking blades which include two arcuate light blocking blades 10-3 and 10-4 (FIG. 8) extending in a direction perpendicular to the scan direction, and two straight light blocking blades 10-1 and 10-2 being parallel to the scan direction.

In order to maintain the uniformness of an illuminance distribution in a direction perpendicular to the scan direction, the slit 10 is provided with a slit-width changing mechanism of a known type. More specifically, in the case of an arcuate slit, the spacing between the two arcuate light blocking blades 10-3 and 10-4 is locally adjusted so that a uniform illuminance distribution is provided as the slit is scanned. This type of a slit width changing mechanism is well known in relation to a unit-magnification exposure system using a mirror to be scanned with an arcuate slit, for example.

Also, the spacing between the light blocking blades 10-1 and 10-2 can be adjusted, in accordance with the area of a pattern to be exposed.

Figure 13:
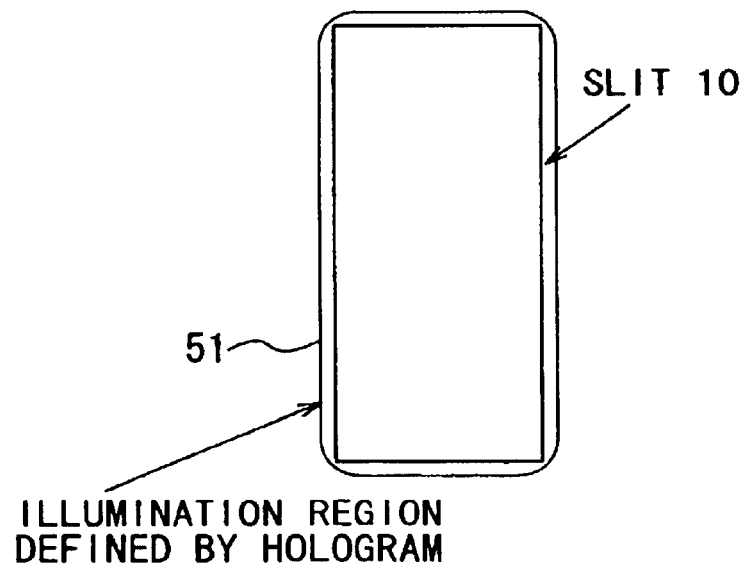
FIG. 13 is a schematic view for explaining the relation between an illumination region by a hologram and a slit.

FIG. 13 illustrates the relation between the slit and the hologram, that is, the illumination region 51 defined by the CGH 7, with reference to a case where the scanning slit has an oblong shape.

Since the illumination region 51 defined by the CGH 7 has a light quantity distribution, it illuminates a region slightly wider than an opening area determined by the scan slit 10. Because of the spacing adjustment described above, the slit 10 has a function for assuring the uniformness of illuminance during the scan.

Also, the slit 10 has a masking function (masking means 11) for selecting exposure/non-exposure of a TEG portion where a test pattern is formed, or for restricting the exposure region such as by projecting excessive light so as to prevent transfer of a pinhole in the chromium region of the light blocking portion. In the scanning exposure apparatus, this masking function is a scan masking function, constituted by a slit subsidiary to the scan of the main assembly. Since the masking function unit needs to discriminate a pattern area on the reticle 13, it is disposed at a position conjugate with the reticle pattern, namely, the position at the focal plane 9.

Figure 9:
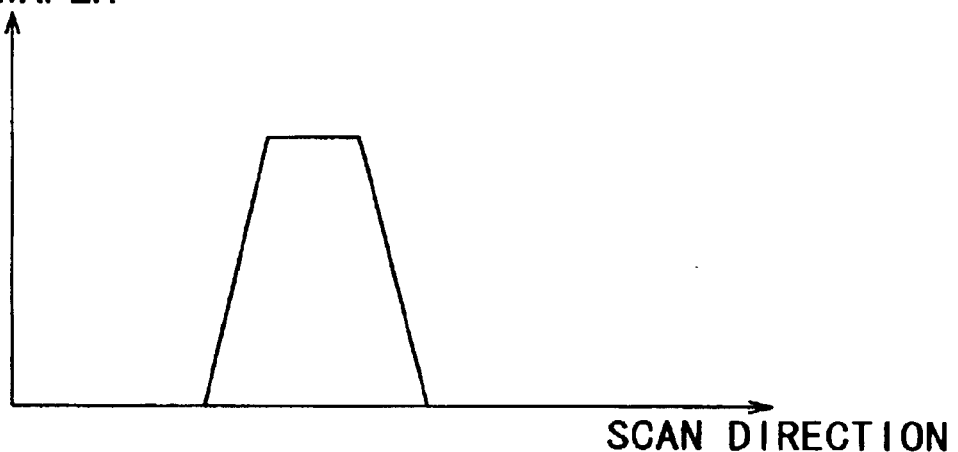
FIG. 9 is a graph for explaining an intensity distribution of a slit upon a wafer, in the FIG. 1 embodiment.

On the other hand, as regards the shape of the slit 10 for the scan exposure, the relation with the pattern of the reticle 13 is not so strict as with the masking unit. Rather, the light intensity distribution of the slit upon the wafer W surface in the scan is not rectangular with respect to the scan direction, as shown in FIG. 9, but preferably it has a trapezoidal distribution, for example.

The intensity distribution at the slant portion of the trapezoidal distribution may not be a straight distribution but may be a smooth distribution such as a half of a Gaussian distribution. Such an intensity-changing portion can be provided by shifting the light blocking blades 10-3 and 10-4 for the arcuate slit from the position (focal plane) 9 being in focus with the reticle pattern.

However, as regards the light blocking blades 10-1 and 10-2 extending in a direction parallel to the scan direction, preferably, they should have a good imaging performance. For this reason, they are disposed at a position close, as much as possible, to the conjugate plane 9 or the reticle pattern. Since there is the masking unit at the position of the conjugate plane 9, the light blocking blades 10-1 and 10-2 may desirably be placed close to the conjugate plane 9, while avoiding interference therewith.

Figure 10:
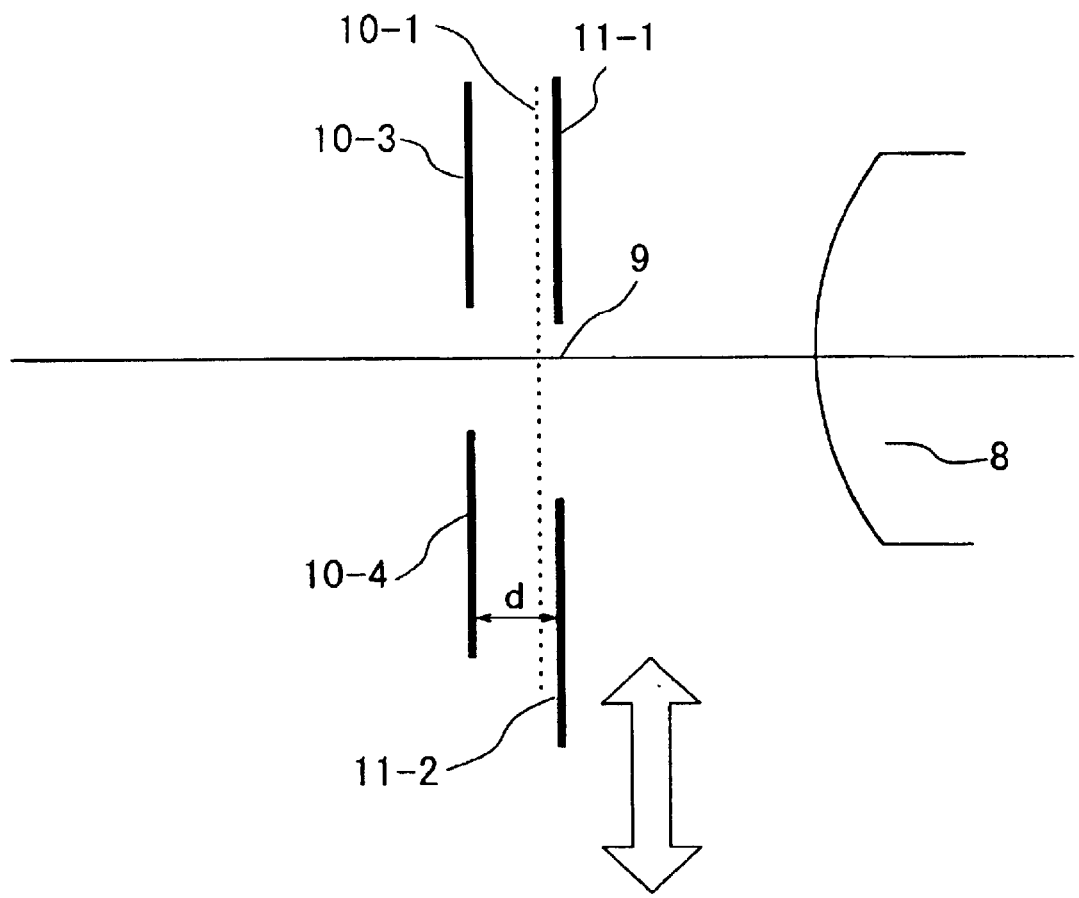
FIG. 10 is a schematic view for explaining the relation between an arcuate slit and a scanning masking blade, in the FIG. 1 embodiment.

For the slit being arcuate, as shown in FIG. 10, the light blocking blades 10-3 and 10-4 which are a fixed arcuate slit, are disposed with a defocus of a distance d from the conjugate position 9 of the pattern of the reticle 13. At the conjugate position 9, there are light blocking blades 11-1 and 11-2 for forming a straight slit and having a masking function, capable of scanning.

The distance d may have a negative value. Namely, it may be placed at a side of the light blocking blade 11-1 or 11-2 (disposed at the conjugate position 9), facing the Fourier transform lens 8. The light blocking blades 11-1 and 11-2 can scan independently of each other, such that selection of exposure at the TEG pattern described above is assured or the influence of a pinhole of a light blocking film can be avoided.

The blades 10-1 and 10-2 are disposed close to the conjugate position 9 as much as possible, while avoiding interference with the blades 11-1 and 11-2.

Also, when the slit is oblong, in order to improve performance of masking and to reduce the influence of blur due to the masking, like the case of an arcuate slit, a slit 11 having a straight edge and being able to perform independent scan, is disposed at a position conjugate with the reticle and, additionally, a slit 10 for defining an oblong shape for the scan is disposed at a position shifted from the conjugate position. Also, on that occasion, as regards the light blocking blades 10-1 and 10-2 extending in parallel to the scan direction, they are disposed close to the conjugate position 9 as much as possible, while avoiding interference with the blades 11-1 and 11-2.

The light passing through the slit and the masking unit then enters a masking image optical system 12. Recently, for a better yield, an imaging specification of a precision higher than the conventional precision is required for the masking function. This causes an increase of the number of lenses of the imaging optical system 12.

In this embodiment, as the imaging optical system 12, a Dyson optical system being known as having a unit magnification and a high performance is used. The Dyson optical system 12 is a simple system comprising one lens and one mirror. Light passes the lens twice. This optical system 12 has a special imaging function which does not use axial light, but uses abaxial light.

In a Dyson optical system, an abaxial annular region, without using axial light, is a good imaging region. Therefore, the optical system is structured so that an arcuate opening or an oblong opening of the slit is placed in the good imaging region. Although a Dyson optical system itself is a concentric system, the concentricity may be slightly degraded so that the arcuate or oblong shape can be put into the good imaging region. However, this is within the range of design, and details will be omitted here.

The use of a Dyson optical system in an optical system used with an $F_2$ excimer laser, in which reduction of the number of lenses is required, enables that a desired performance is accomplished with a minimum number of lenses.

The structure described above has a dual transform function. That is, the light from the laser 1 is transformed by the zoom optical system (2, 5) and the double-axicon unit 4, and the like, into a desired illumination condition and, additionally, it is transformed into light of a desired slit shape by means of the CGH 7, which is formed on the focal plane 9. With the use of a Dyson optical system 12 having a very small number of components, the light is directed up to the reticle 13.

As regards the first transform to meet the illumination condition such as ring zone illumination in the embodiment, it has been described with respect to a portion where the light is parallel light. The condition for the parallel light is that the number of lenses is small, and also, in regard to the film, the incidence angle is restricted. Therefore, the optical condition is easy in a narrow band, and the efficiency of light utilization can be high.

Further, since, in the first transform, the beam shape after being transformed is limited to being circular, ring-like or quadruple, for example, there is an advantage that the shape of light can be accomplished without using the function of the hologram, for converting it into a complicated pattern. Further, the condition of parallel light is not always necessary. The system can be structured with convergent light or divergent light. However, parallel light has advantages such as described above.

The second transform, that is, the transform to a slit, is carried out by using the CGH 7 singly. It does not need a complicated optical system. As regards an optical element for making uniform an illuminance distribution, generally, a fly's eye lens is used. However, since the uniforming function can be covered by the slit width adjusting mechanism, use of a fly's eye lens having a large number of optical elements requiring complicated assembling can be omitted. This is advantageous with respect to the cost. The second transform involves many variations, as an arcuate shape and oblong shape, for example. Therefore, the transform function of the hologram is used effectively.

When the incident light satisfies the incidence condition as has been described with reference to FIG. 12, a desired pattern can be produced. It is a large advantage that a change in shape of the incident light, and response to various illumination conditions, does not cause a loss of light quantity.

With respect to the structure, in addition to this, there is no necessity of using an additional optical element for directing zeroth order light to the light quantity controlling sensor DS, to be inserted into the light path to extract light. Thus, use of a CGH has a large advantage. Use of a Dyson optical system for the masking is also effective in reducing the number of components.

The light passing through the slit 10 is projected by the imaging optical system 12 and a mirror M2, to illuminate the reticle 13 as a slit. By scanningly moving the reticle 13 and the wafer W, a pattern formed on the reticle 13 is scanningly projected on the wafer W.

In this embodiment, as described hereinbefore, an illumination optical system or an exposure apparatus having the same by which a good light utilization efficiency, being applicable even to an $F_2$ excimer laser, is accomplished.

Figure 2:
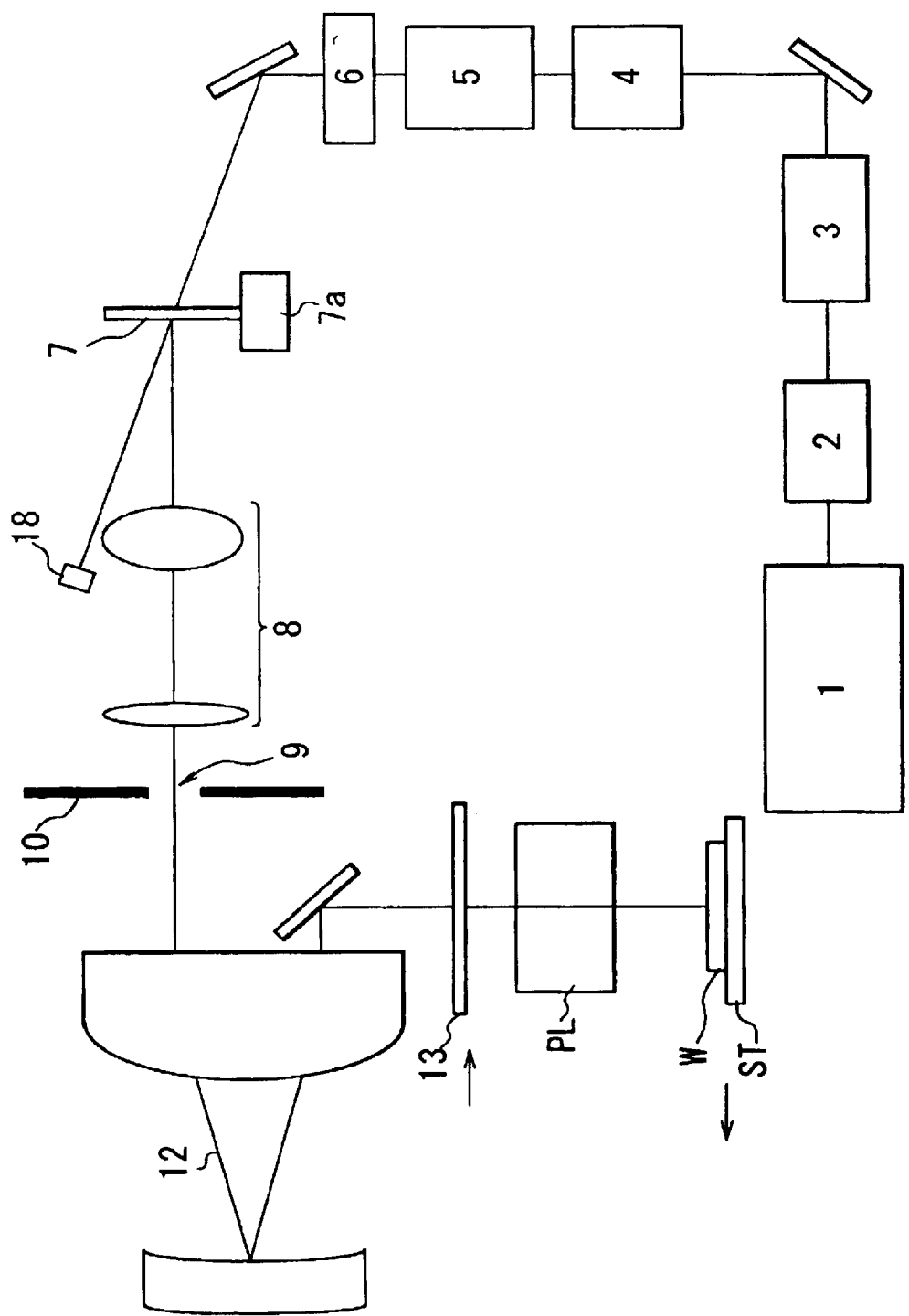
FIG. 2 is a schematic view of a main portion of a second embodiment wherein an illumination system of the present invention is incorporated into a scanning exposure apparatus.

FIG. 2 is a schematic view of a main portion of a second embodiment in which an illumination system of the present invention is incorporated into a scan type exposure apparatus.

The second embodiment of FIG. 2 differs from the first embodiment of FIG. 1 only in that a transmission type CGH 7 is used as a CGH. The remaining portion has substantially the same structure as that of the first embodiment.

Although an $F_2$ excimer laser needs a CGH made of fluorite, an ArF excimer laser or a KrF excimer laser can use quartz. Therefore, there is no large problem in the manufacture.

When an $F_2$ excimer laser is used, a dry quartz having been doped by fluorine, as remarkably advanced in recent years, can be used. The structure of FIG. 2 can be applied, on that occasion.

In this embodiment, like numerals as those of the first embodiment are assigned to corresponding elements.

The structure from the laser 1 to the oblique incidence correcting optical system 6 is exactly the same as that of the FIG. 1 embodiment. Because of oblique incidence of light on the CGH 7, use of the oblique incidence correcting optical system is necessary even in the transmission type structure.

As a feature of this embodiment, the CGH 7 has a transmission type structure as described above. The light transmitted through it enters an optical system following a Fourier transform lens 8, like FIG. 1. Similarly, a normal to the CGH 7 corresponds to the optical system following the Fourier transform lens 8. While parallel light is obliquely incident on the CGH 7, due to the effect of the oblique incidence correcting optical system 6, the light after the Fourier transform lens has a 90-degree revolutional symmetry.

The zeroth order light passing through the CGH 7 is directed to a light integrator 8, for detecting the light quantity for the light quantity control. Since a transmission type CGH has a better efficiency than a reflection type, it can well be used with an ArF excimer laser or a KrF excimer laser. Also, it is usable with an $F_2$ excimer laser. When fluorine-doped quartz having a problem with respect to the durability is machined into a CGH 7, if this is replaced by a part having a long lifetime, the structure is sufficiently possible. Also, like the case of FIG. 1, the CGH 7 may be minutely oscillated by driving means 7a in a plane perpendicular to the optical axis of the Fourier transform lens 8, thereby to remove the speckle. This is effective to smooth any non-uniformness of illuminance, in a microscopic sense.

The function and operation of the Fourier transform lens 8 is the same as that of the FIG. 1 embodiment.

Figure 3:
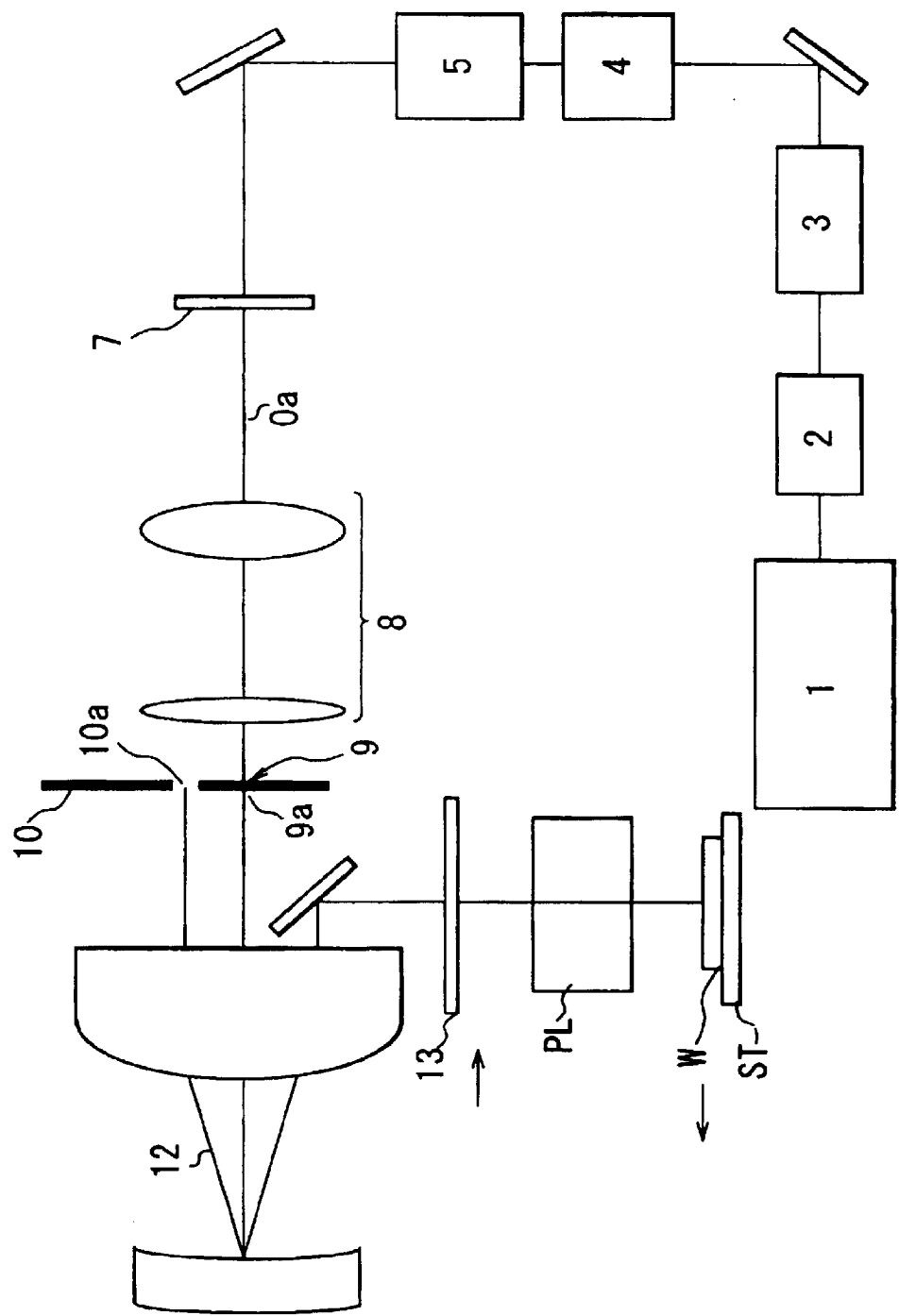
FIG. 3 is a schematic view of a main portion of a third embodiment wherein an illumination system of the present invention is incorporated into a scanning exposure apparatus.

FIG. 3 is a schematic view of a main portion of a third embodiment in which an illumination system of the present invention is incorporated into a scan type exposure apparatus.

This embodiment differs from the second embodiment in that light incident on a CGH 7 is perpendicular. The remaining portion has essentially the same structure.

In this embodiment, like numerals as those of the first and second embodiments are assigned to corresponding elements.

In this embodiment, since the light is incident on the CGH 7 by perpendicular incidence, it is not necessary to correct a lateral-to-longitudinal difference which might be caused by oblique incidence. Therefore, the oblique incidence correction optical system 6 is omitted.

The structure in which light is perpendicularly incident on the CGH 7 is particularly effective to a slit opening 10a of an arcuate shape. This because, when an arcuate slit is used, the point upon the optical axis of the imaging plane 9 of the Fourier transform lens 8 is not used.

In FIG. 3, the position of the opening 10a of the slit 10 is deviated from the point 9a on the optical axis of the Fourier transform lens 8. This is because the light quantity distribution of an arcuate slit 7a defined by diffraction light from the CGH 7, as shown in FIG. 1, is produced at a position different from the point on the optical axis. If the optical system is illustrated along a section containing the optical axis, as shown in the drawing, the position 10a of the slit 10 is displaced from the focal point position 9 of the Fourier transform lens 8.

However, zeroth order light of the light perpendicularly incident on the CGH 7 is such light which passes through the CGH 7 without being diffracted thereby, and therefore, it can be regarded as being approximately the incident parallel light. It is imaged at the focal point position of the Fourier transform lens 8. The focal point position is at a point 9a on the optical axis, upon the imaging plane 9 of the Fourier transform lens 8.

Figure 11:
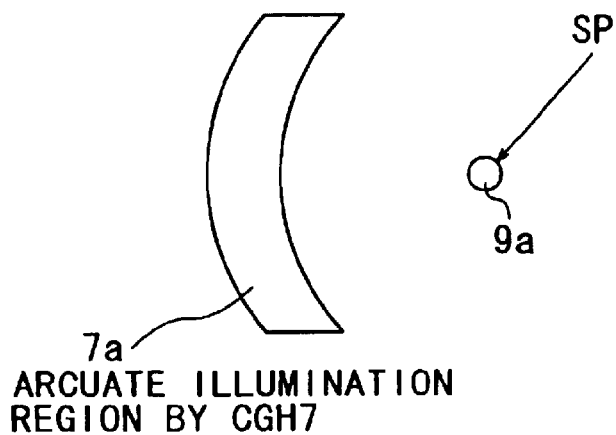
FIG. 11 is a schematic view for explaining a focal plate of a Fourier transform lens in arcuate illumination, in the third embodiment of the present invention.

As a result, at the position on the imaging plane, as shown in FIG. 11, a diffraction image of the arcuate slit 7a by the CGH 7 and a spot SP by the zeroth order light are spatially separated. Once a photoelectric sensor DS for a light integrator is provided at the position 9a of the point on the optical axis of the imaging plane 9, light can be detected for the control of the exposure amount, without inserting a special optical element.

The structure of FIG. 3 is very simple, as no oblique incidence correcting optical system is used. This is an advantage of arcuate illumination. Also, as shown in the drawing, in the case of an arcuate slit, the structure in which the Fourier transform lens 8 and a Dyson optical system 12 are registered with each other, is possible. The relation between optical axes of the Fourier transform lens 8 and the Dyson optical system 12 can be applied also to the first and second embodiments.

When the slit opening is oblong, if an ordinary structure is adopted, the central position of the oblong shape is registered with a point on the optical axis. As a result, the zeroth order light is superposed, and it becomes difficult to obtain a uniform light quantity distribution on the slit plane. It is, therefore, necessary to produce a hologram by which an oblong shape to be formed thereby is produced off the optical axis to prevent the same from being superposed by the zeroth order light.

In FIG. 3, regardless that the slit opening has an arcuate shape or an oblong shape, as long as the Fourier transform lens 8 is telecentric, the matching between the subsequent Dyson optical system 12 and the pupil is satisfied.

Also, the CGH 7 may be oscillated to remove the speckle, like the preceding embodiments.

Figure 4:
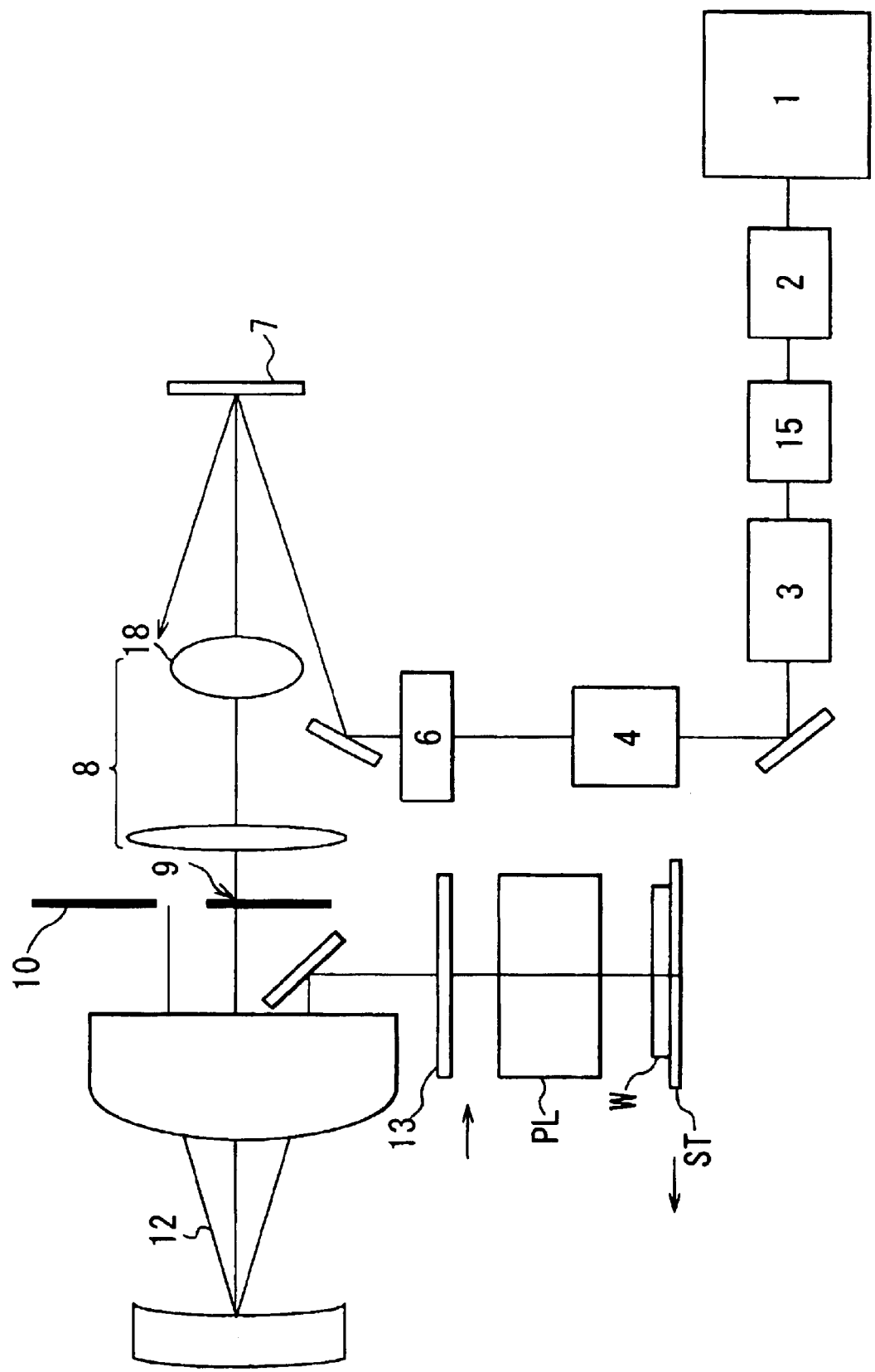
FIG. 4 is a schematic view of a main portion of a fourth embodiment wherein an illumination system of the present invention is incorporated into a scanning exposure apparatus.

FIG. 4 is a schematic view of a main portion of a fourth embodiment in which an illumination system of the present invention is incorporated into a scan type exposure apparatus.

This embodiment differs from the first embodiment in that there is an incoherency-transforming unit 15 for laser light, disposed after the beam shaping optical system 2. The remaining portion has essentially the same structure. This embodiment can meet a phenomenon which arises when the throughput of an exposure apparatus is enlarged and the stage speed for scan exposure is raised. It is particularly effective when the removal of speckle is insufficient due to a reduced pulse number which can be used for the exposure process.

The incoherency-transforming unit 15 may be based on, for example, a method in which light from a laser is divided by a beam splitter into plural light beams to create an optical path difference larger than the coherence length, or a method in which polarization is used to suppress optical interferences, as is known in the art.

In this embodiment, whether the unit 15 should be inserted or not is determined by the relation with respect to the resist sensitivity. If a pulse number sufficient to remove a speckle for exposure of a single point is required, the unit 15 may be omitted.

Since the lithography using an $F_2$ excimer laser requires reduction of the number of constituent lenses as well as omission of unnecessary functions to assure a simple optical system, use of the incoherency-transforming unit 15 may be determined while taking into account the restrictions described above.

Figure 14:
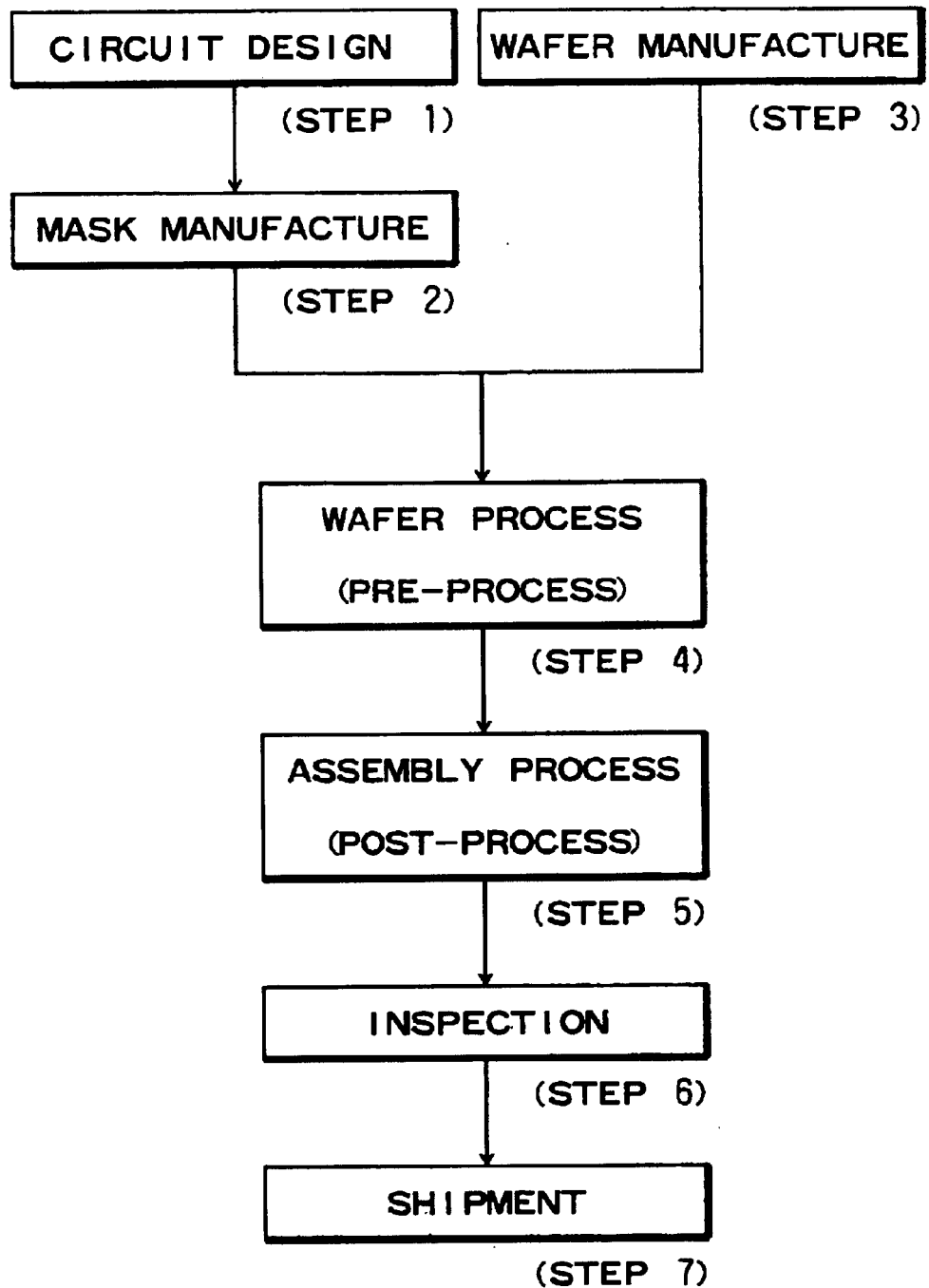
FIG. 14 is a flow chart of device manufacturing processes according to the present invention.

FIG. 14 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the so prepared mask and wafer, circuits are practically formed on the wafer through lithography. Step 5 subsequent to this is an assembly step, which is called a post-process, wherein the wafer having been processed by step 4 is formed into semiconductor chips. This step includes an assembling (dicing and bonding) process and a packaging (chip sealing) process. Step 6 is an inspection step, wherein an operation check, a durability check and so on for the semiconductor devices provided by step 5, are carried out. With these processes, semiconductor devices are completed and they are shipped (step 7).

Figure 15:
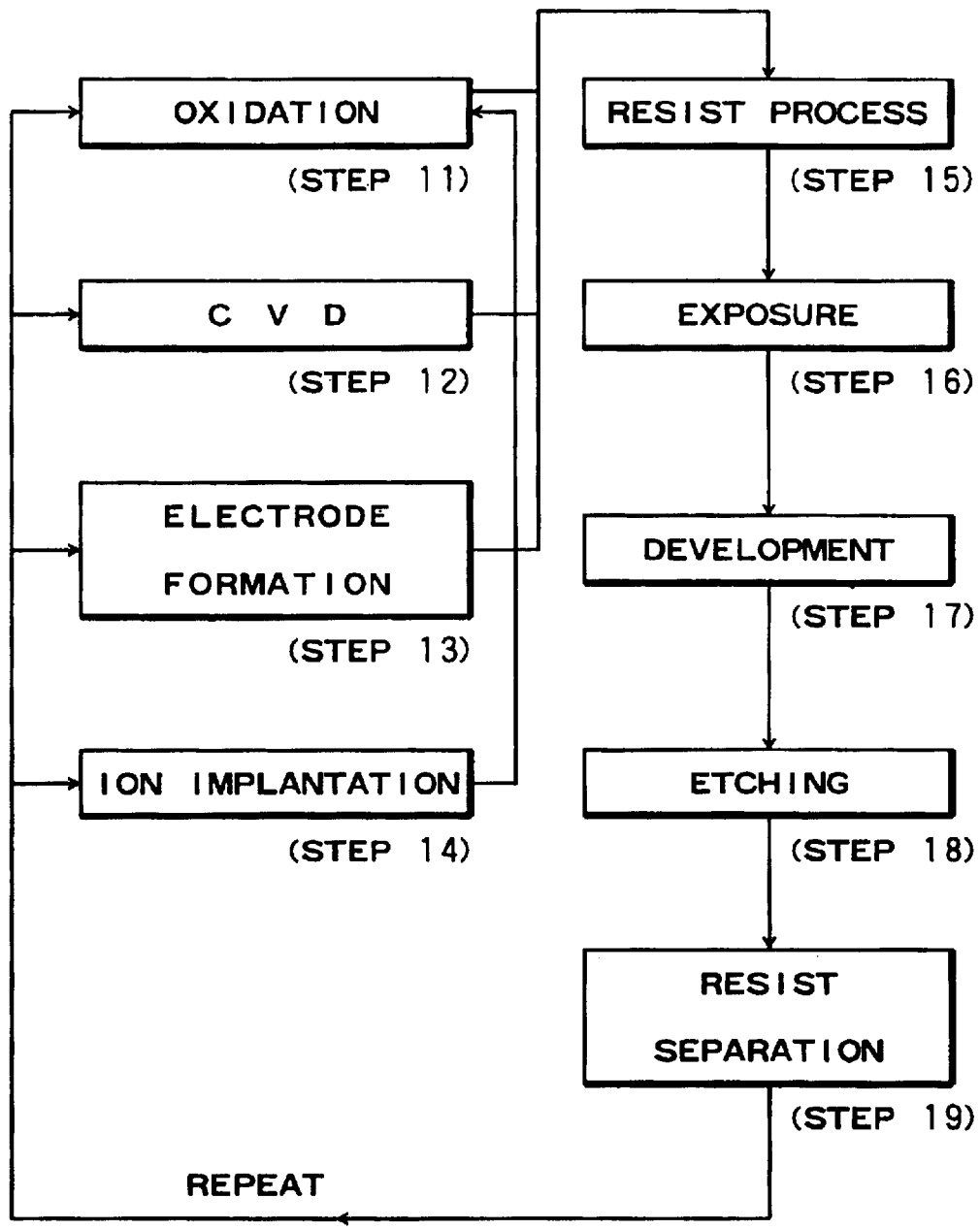
FIG. 15 is a flow chart for explaining details of a wafer process, included in the procedure of FIG. 14.

FIG. 15 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implantation process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described hereinbefore, a hologram is used in a portion of an illumination system, and the shape of a light beam is changed to meet various illumination modes, at the portion before the light is incident on the hologram. This enables the structure of an illumination system having a reduced number of optical components and having a good efficiency, with the performance of a coating film being well utilized.

Particularly, when an optical system before a hologram is processed by parallel light, the efficiency increases largely.

Further, because of the use of a hologram, the illumination system can be very flexible and it can meet special requirements of a projection optical system. Thus, an illumination optical system being applicable to lithography using an $F_2$ excimer laser can be accomplished.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for illuminating an original with light from a light source and for projecting a pattern of the original, as illuminated, onto a surface to be exposed, said apparatus comprising:
   a hologram;
   an optical system for projecting light from the light source onto said hologram;
   slit means having an aperture formed thereon, said slit means being disposed at a predetermined position where light of a shape like the aperture of said slit means is to be substantially produced by said hologram; and
   an imaging optical system for illuminating the original with the light passed through the aperture of said slit means,
   wherein said slit means serves to determine an illuminance region of light projected onto the original.

2. An exposure apparatus according to claim 1, wherein said imaging optical system serves to image the aperture of said slit means, upon the surface to be illuminated or at a position adjacent thereto.

3. An exposure apparatus according to claim 1, wherein said hologram is disposed perpendicularly to an optical axis of an optical system following said hologram.

4. An exposure apparatus according to claim 1, further comprising an axicon for changing the shape of light impinging on said hologram.

5. An exposure apparatus according to claim 1, further comprising a pyramidal prism for changing the shape of light impinging on said hologram.

6. An exposure apparatus according to claim 1, further comprising an axicon and a pyramidal prism for changing the shape of light impinging on said hologram, wherein said axicon and said prism are inserted into or retracted out of a light path in accordance with an illumination condition.

7. An exposure apparatus according to claim 1, wherein said optical system has a zoom lens for changing the size of light impinging on said hologram.

8. An exposure apparatus according to claim 1, wherein parallel light impinges on said hologram.

9. An exposure apparatus according to claim 1, further comprising a photoelectric detecting element for receiving zeroth order light from said hologram.

10. An exposure apparatus according to claim 1, wherein said optical system has an oblique incidence correcting optical element for causing light to be obliquely incident on said hologram and for correcting a lateral-to-longitudinal difference of effective light upon said hologram due to the oblique incidence.

11. An exposure apparatus according to claim 1, wherein said imaging optical system has a Dyson optical system.

12. An exposure apparatus according to claim 1, wherein the shape of the aperture is oblong or arcuate.

13. An exposure apparatus according to claim 1, wherein said slit means has a first light blocking blade disposed at a position optically conjugate with the surface to be illuminated, and a second light blocking blade disposed at a position shifted from the optically conjugate position in an optical axis direction.

14. An exposure apparatus according to claim 1, further comprising oscillation means for oscillating said hologram.

15. An exposure apparatus according to claim 1, wherein the aperture light is formed by passing diffraction light from said hologram through a Fourier transform lens.

16. An exposure apparatus according to claim 15, wherein said Fourier transform lens comprises a telecentric system.

17. An exposure apparatus according to claim 15, wherein said Fourier transform lens is arranged so that at least a portion of the lens is movable along an optical axis direction.

18. An exposure apparatus according to claim 1, wherein the original is a reticle and the surface to be exposed is a surface of a wafer, and wherein said exposure apparatus is a scanning exposure apparatus arranged so that a pattern formed on the reticle is transferred to the wafer surface while the reticle and the wafer are scanned in synchronism with each other.

19. A device manufacturing method, comprising the steps of:
   coating a wafer with a photosensitive material;
   transferring a pattern formed on a reticle onto a wafer by use of a scanning exposure apparatus as recited in claim 18; and
   developing the photosensitive material on the exposed wafer.

* * * * *